(12) United States Patent
Ota et al.

(10) Patent No.: US 8,999,801 B2
(45) Date of Patent: Apr. 7, 2015

(54) NANOWIRE CHANNEL FIELD EFFECT DEVICE AND METHOD FOR MANUFACTURING THE SAME

(75) Inventors: Kensuke Ota, Fujisawa (JP); Masumi Saitoh, Yokohama (JP); Toshinori Numata, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 34 days.

(21) Appl. No.: 13/236,199

(22) Filed: Sep. 19, 2011

(65) Prior Publication Data
US 2012/0235152 A1   Sep. 20, 2012

(30) Foreign Application Priority Data

Mar. 18, 2011 (JP) .................................. 2011-60630

(51) Int. Cl.
| | |
|---|---|
| H01L 21/336 | (2006.01) |
| H01L 29/10 | (2006.01) |
| H01L 29/06 | (2006.01) |
| H01L 29/66 | (2006.01) |
| H01L 29/78 | (2006.01) |
| H01L 21/265 | (2006.01) |

(52) U.S. Cl.
CPC ...... *H01L 29/0673* (2013.01); *H01L 29/66742* (2013.01); *H01L 29/66803* (2013.01); *H01L 29/785* (2013.01); *H01L 21/26506* (2013.01); *H01L 21/26586* (2013.01)

(58) Field of Classification Search
None
See application file for complete search history.

(56) References Cited

U.S. PATENT DOCUMENTS

| | | | | |
|---|---|---|---|---|
| 6,413,802 | B1 * | 7/2002 | Hu et al. | 438/151 |
| 7,341,902 | B2 * | 3/2008 | Anderson et al. | 438/197 |
| 8,283,217 | B2 * | 10/2012 | Guo et al. | 438/151 |

(Continued)

FOREIGN PATENT DOCUMENTS

| | | |
|---|---|---|
| JP | 62-076772 | 4/1987 |
| JP | 2005-528810 | 9/2005 |

(Continued)

OTHER PUBLICATIONS

Bio Kim; Seung-Hyun Lim; Dong Woo Kim; Nakanishi, T.; Sangryol Yang; Jae-Young Ahn; HanMei Choi; Kihyun Hwang; Yongsun Ko; Chang-Jin Kang; , "Investigation of ultra thin polycrystalline silicon channel for vertical NAND flash," Reliability Physics Symposium (IRPS), 2011 IEEE International , vol., No., pp. 2E.4.1-2E.4.4, Apr. 10-14, 2011 doi: 10.1109.*

(Continued)

*Primary Examiner* — Mark Tornow
*Assistant Examiner* — Priya Rampersaud
(74) *Attorney, Agent, or Firm* — Finnegan, Henderson, Farabow, Garrett & Dunner, L.L.P.

(57) ABSTRACT

A semiconductor device according to an embodiment includes: a polycrystalline semiconductor layer formed on an insulating film, the polycrystalline semiconductor layer including a first region and second and third regions each having a greater width than the first region, one of the second and third regions being connected to the first region; a gate insulating film formed at least on side faces of the first region of the polycrystalline semiconductor layer; a gate electrode formed on the gate insulating film; and gate sidewalls made of an insulating material, the gate sidewalls being formed on side faces of the gate electrode on sides of the second and third regions. Content of an impurity per unit volume in the first region is larger than content of the impurity per unit volume in the second and third regions.

7 Claims, 13 Drawing Sheets

A-A CROSS-SECTION

(56) References Cited

U.S. PATENT DOCUMENTS

| | | | |
|---|---|---|---|
| 2005/0227435 A1* | 10/2005 | Oh et al. | 438/257 |
| 2008/0111185 A1* | 5/2008 | Cheng | 257/347 |
| 2009/0072276 A1* | 3/2009 | Inaba | 257/255 |
| 2009/0283806 A1* | 11/2009 | Yang et al. | 257/288 |
| 2011/0168982 A1* | 7/2011 | Bangsaruntip et al. | 257/38 |
| 2011/0280076 A1* | 11/2011 | Samachisa et al. | 365/185.17 |
| 2012/0061762 A1* | 3/2012 | Cheng et al. | 257/365 |

FOREIGN PATENT DOCUMENTS

| | | |
|---|---|---|
| JP | 2006-080519 | 3/2006 |
| JP | 2008-085357 | 4/2008 |
| WO | WO 2004/019414 | 3/2004 |

OTHER PUBLICATIONS

Saitoh, M. et al., "Semiconductor Device and Method for Manufacturing the Same," U.S. Appl. No. 13/082,103, filed Apr. 7, 2011.

Chen, J. et al., "Experimental Study of Mobility in [110]- and [100]-Directed Multiple Silicon Nanowire GAA MOSFETs on (100) SOI," 2008 Symposium on VLSI Technology Digest of Technical Papers, pp. 32-33, (2008).

Suk, S. D. et al., "Characteristics of sub 5nm Tri-Gate Nanowire MOSFETs with Single and Poly Si Channels in SOI structure," 2009 Symposium on VLSI Technology Digest of Technical Papers, pp. 142-143, (2009).

Notification of Reason for Rejection, issued by Japanese Patent Office in counterpart Japanese Patent Application No. 2011-060630, dated Mar. 12, 2013 (4 pages including translation).

Official Action issued by Taiwanese Intellectual Property Office, dated Dec. 12, 2013, in Taiwanese patent application No. 100133819 (9 pages including translation).

Decision of Rejection in First Examination issued by the Taiwan Intellectual Property Office on Aug. 7, 2014, for Taiwanese Patent Application No. 100133819, and English-language translation thereof.

* cited by examiner

A-A CROSS-SECTION

B-B CROSS-SECTION

C-C CROSS-SECTION

A-A CROSS-SECTION

B-B CROSS-SECTION

C-C CROSS-SECTION

D-D CROSS-SECTION

A-A CROSS-SECTION

ION IMPLANTATION

NANOWIRE CHANNEL FIELD EFFECT DEVICE AND METHOD FOR MANUFACTURING THE SAME

CROSS-REFERENCE TO RELATED APPLICATION

This application is based upon and claims the benefit of priority from prior Japanese Patent Application No. 2011-60630 filed on Mar. 18, 2011 in Japan, the entire contents of which are incorporated herein by reference.

FIELD

Embodiments described herein relate generally to a semiconductor device and a method for manufacturing the semiconductor device.

BACKGROUND

As structures to realize ultrafine MOSFETs having gate lengths of 30 nm or less, nanowire channel transistors (nanowire transistors) that can restrain short channel effects are expected to replace conventional plane-type transistors. Such a nanowire transistor includes: a silicon substrate; a buried oxide film formed on the silicon substrate; a semiconductor layer that is formed on the buried oxide film and includes one or more plate-like silicon nanowires to be channel regions; a gate insulating film formed on the side faces and upper faces of the nanowires; a gate electrode formed on the gate insulating film; gate sidewalls formed on both sides of the gate electrode (in the gate length direction); and a source region and a drain region that are formed in the nanowires and in the wide areas of the semiconductor layer, with the channel regions being interposed between the source region and the drain region. In the nanowires, the regions on which the gate electrode is formed operate as the channel regions. The channel regions each have a plate-like structure having a width (a length in the gate width direction) of approximately 3 nm to 25 nm and a height of approximately 3 nm to 40 nm. As the channel regions are covered with the gate electrode, the gate electrode has a large influence, and can restrain short channel effects. In a nanowire transistor, the three faces of the upper face and both side faces of each nanowire serve as a channel region. Therefore, nanowire transistors are also called tri-gate transistors.

In nanowire transistor manufacture, a SOI substrate is often used, instead of a bulk silicon substrate, mainly for the following two reasons. One of the reasons is that the buried oxide film can be used as the etching stopper in the nanowire processing. The other reason is that leak current between the source and drain in an OFF state can be certainly restrained by virtue of the existence of the buried oxide film as an insulator beneath the channel regions. However, a SOI substrate is more expensive than a bulk substrate, and leads to a cost increase in the entire manufacturing process.

To solve the above problem, a nanowire transistor including nanowires made of polycrystalline silicon on a bulk silicon substrate has been considered. This nanowire transistor differs from a nanowire transistor formed on a SOI substrate in that a SOI layer that is made of monocrystalline silicon and includes one or more nanowires is replaced with a polycrystalline silicon layer including one or more nanowires. In the polycrystalline silicon nanowires, the regions on which the gate electrode is formed operate as channel regions. However, due to the influence of crystal grain boundaries, polycrystalline silicon has much poorer mobility than monocrystalline silicon. Therefore, performance of a polycrystalline silicon nanowire transistor is much lower than performance of a nanowire transistor formed on a SOI substrate. Also, due to the influence of random crystal grain boundaries, variations in characteristics among devices are very large in polycrystalline silicon nanowire transistors.

DETAILED DESCRIPTION

A method of manufacturing a semiconductor device according to an embodiment includes: forming a first insulating film on a semiconductor substrate; forming a first semiconductor layer on the first insulating film, and forming a mask on an upper face of the first semiconductor layer, the first semiconductor layer including a first region having side faces and second and third regions each having a greater width than the first region, at least one of the second and third regions being connected to the first region; performing first ion implantation to implant ions into the side faces of the first region of the first semiconductor layer, using the mask; performing a first heat treatment, after the first ion implantation is performed; forming a gate insulating film at least on the side faces of the first region of the first semiconductor layer, after the mask is removed; forming a gate electrode on the gate insulating film; forming gate sidewalls made of an insulating material on side faces of the gate electrode on sides of the second and third regions; and performing second ion implantation at least into the second and third regions of the first semiconductor layer.

The following is a description of embodiments, with reference to the accompanying drawings.

First Embodiment

Figure 1:
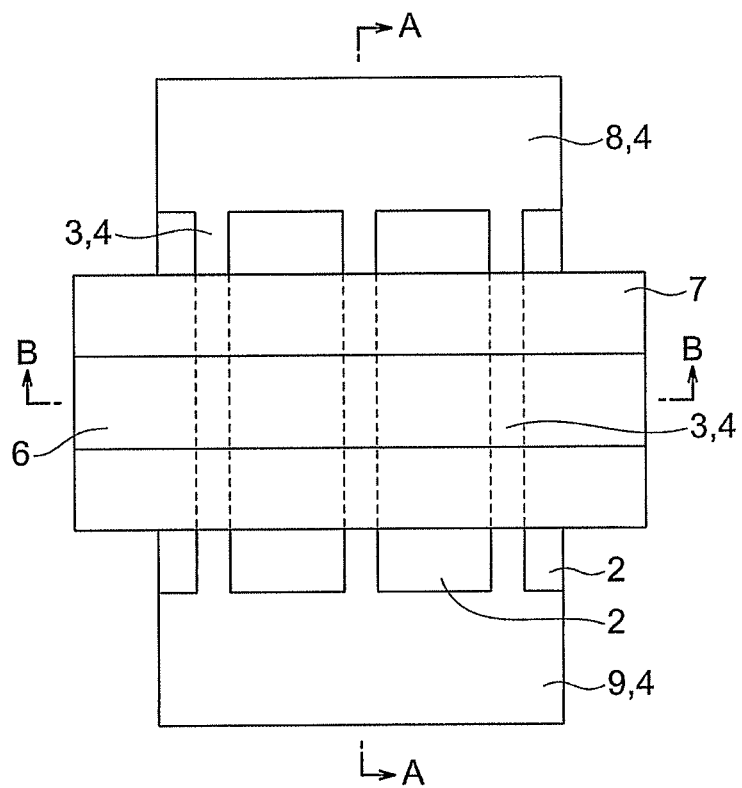
FIG. 1 is a top view of a semiconductor device according to a first embodiment.
Figure 2:
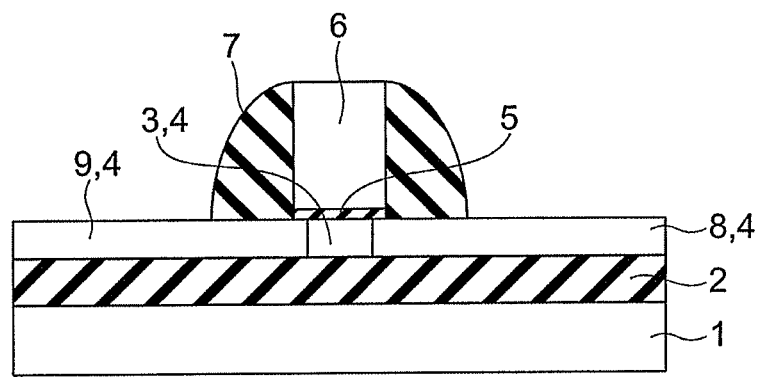
FIG. 2 is a cross-sectional view taken along the gate length direction of the semiconductor device according to the first embodiment.
Figure 3:
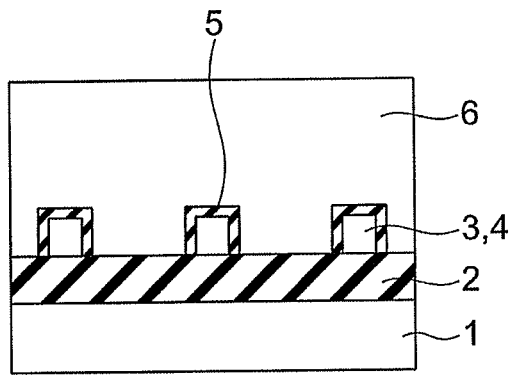
FIG. 3 is a cross-sectional view taken along the gate width direction of the semiconductor device according to the first embodiment.

Referring to FIGS. 1 through 3, a semiconductor device according to a first embodiment is described. The semiconductor device of this embodiment includes a polycrystalline silicon nanowire transistor (hereinafter also referred to as a nanowire transistor). FIG. 1 is a plan view of this nanowire transistor. FIG. 2 is a cross-sectional view taken along the section plane A-A of FIG. 1. FIG. 3 is a cross-sectional view taken along the section plane B-B of FIG. 1. The section plane A-A is a section plane in the gate length direction, and the section plane B-B is a section plane in the gate width direction.

This nanowire transistor includes an oxide film 2 formed on a silicon substrate 1, and a polycrystalline silicon layer 4 formed on the oxide film 2. The polycrystalline silicon layer 4 includes one or more plate-like nanowire regions 3 including channel regions, and a source region 8 and a drain region 9 formed on both sides of the nanowire regions 3. In FIG. 1, three nanowire regions 3 are formed, and each of the nanowire regions 3 is connected to the source region 8 and the drain region 9. That is, the source region 8 and the drain region 9 serve as the common source region and the common drain region among the nanowire regions 3. A gate insulating film 5 is formed to cover part of the side faces of each nanowire region 3 in the direction from the source region 8 to the drain region 9, and a part of the upper region of each nanowire region 3. A gate electrode 6 is formed to cover the gate insulating film 5. Gate sidewalls 7 made of an insulating material are formed on the side faces of the gate electrode 6 on the side of the source region 8 and on the side of the drain region 9. The oxide film 2 is exposed through the regions that are outside the nanowire regions 3 and are not covered with the gate sidewalls 7 and the gate electrode 6.

In the nanowire transistor having this structure, the regions in the nanowire regions 3 on which the gate electrode 6 is formed serve as the channel regions. The channel regions each have a plate-like structure (a nanowire structure) of approximately 3 nm to 25 nm in width or length in the gate width direction and of approximately 3 nm to 40 nm in height. As will be described later, impurity ions for amorphization are obliquely implanted into the nanowire regions 3 made of polycrystalline silicon, and the nanowire regions 3 contain a large amount of impurity ions implanted at the time of the oblique ion implantation. Therefore, the density of the contained impurity ions in the nanowire region 3 (the content of the impurity ions per unit volume) is higher than the ion density in the non-nanowire regions (the regions other than the nanowire regions) in the polycrystalline silicon layer 4.

Referring now to FIGS. 4 through 9, a method of manufacturing the semiconductor device according to the first embodiment is described.

Figure 4:
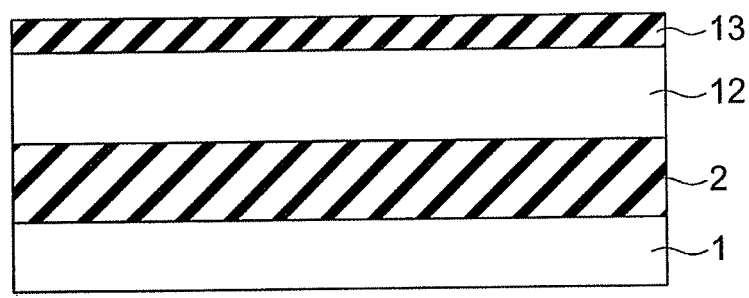
FIG. 4 is a cross-sectional view showing a semiconductor device manufacturing process according to the first embodiment.

First, as shown in FIG. 4, the oxide film 2, an amorphous silicon layer 12, and a hard mask layer 13 are formed in this order on the bulk silicon substrate 1. The thickness of the amorphous silicon layer 12 is approximately 3 nm to 40 nm. Instead of an amorphous silicon layer 12, a polycrystalline silicon layer can be formed. In that case, the later described first heat treatment becomes unnecessary.

Figure 5:
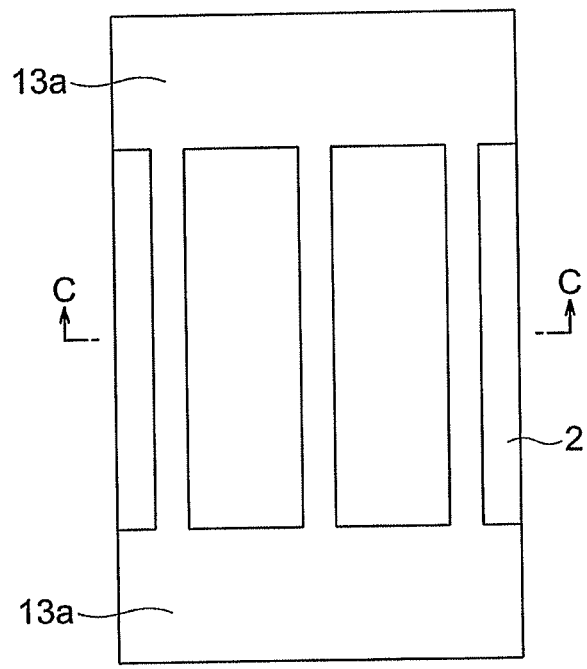
FIG. 5 is a top view showing the semiconductor device manufacturing process according to the first embodiment.
Figure 6:
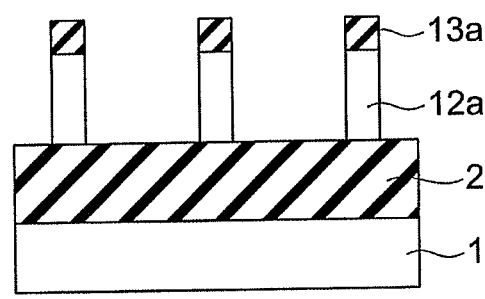
FIG. 6 is a cross-sectional view showing a semiconductor device manufacturing process according to the first embodiment.

As shown in FIGS. 5 and 6, patterning is then performed on the hard mask layer 13 by a known lithography technique, to form a hard mask 13a. Etching is then performed on the amorphous silicon layer 12 with the use of the hard mask 13a. FIG. 5 is a top view of the structure after the etching, and FIG. 6 is a cross-sectional view taken along the section plane C-C of FIG. 5. Through the etching, the amorphous silicon layer 12 turns into an amorphous silicon layer 12a that includes nanowire regions 3 narrowed in the gate width direction and regions that have great widths and are connected to the nanowire regions 3 and are located on both sides of the nanowire regions 3. In FIG. 5, the amorphous silicon layer 12a cannot be seen, hidden by the hard mask 13a. That is, the amorphous silicon layer 12a exists beneath the hard mask 13a. The width of each plate-like amorphous-silicon-layer nanowire region 3 is approximately 3 nm to 25 nm. As the material of the hard mask layer 13, a silicon oxide film, a silicon nitride film, or the like can be used.

The first heat treatment is then performed, to crystallize the amorphous silicon layer 12a and form a polycrystalline silicon layer. The first heat treatment can be performed immediately after the process to form the amorphous silicon layer 12 and the hard mask layer 13 illustrated in FIG. 4. In a case where the first heat treatment is performed in a thermal diffusion furnace, the heat treatment conditions are preferably as follows: the heat treatment is performed in a nitrogen atmosphere at 400° C. to 1200° C. for several microseconds to several tens of hours. However, crystallization can be performed by laser anneal. In the first heat treatment, the crystal grains in the nanowire regions 3 remain minute crystal grains, having being crystal-grown from nuclei randomly formed.

Figure 7:
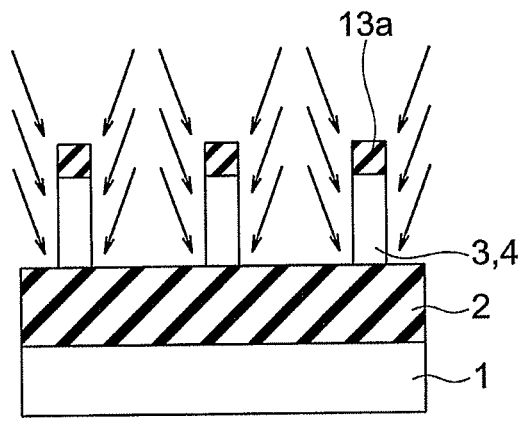
FIG. 7 is a cross-sectional view showing a semiconductor device manufacturing process according to the first embodiment.
Figure 8:
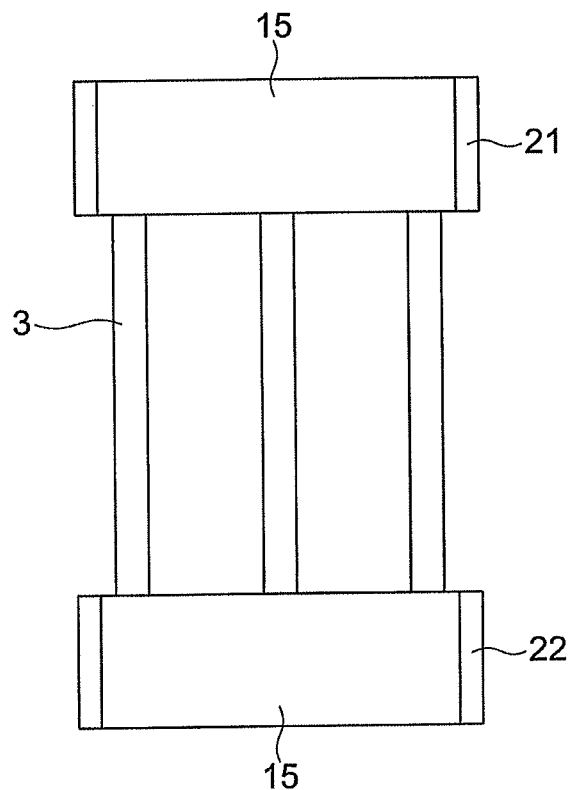
FIG. 8 is a top view showing the semiconductor device manufacturing process according to the first embodiment.
Figure 9:
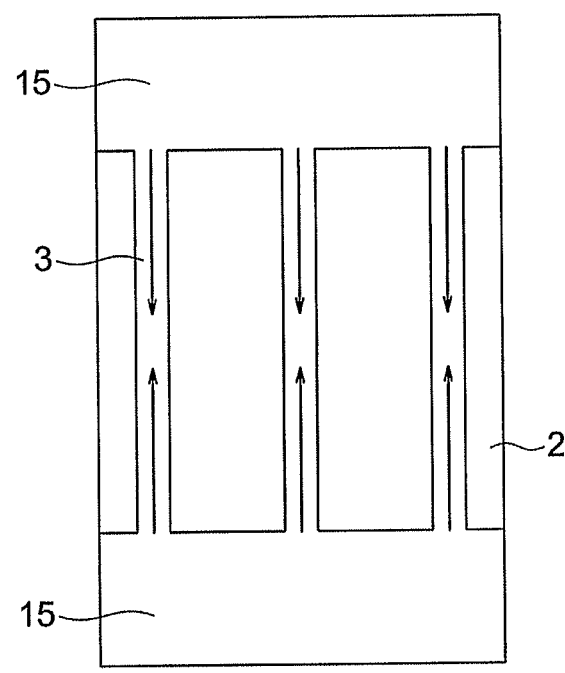
FIG. 9 is a top view for explaining polycrystallization of the nanowire regions in the first embodiment.

As shown in FIG. 7, impurity ions are implanted into the polycrystalline silicon layer obliquely from above, or in a direction tilted with respect to the direction from one of the wide regions to the other one of the wide regions connected to the nanowire regions 3 and at an angle that is greater than 0 degree but is smaller than 90 degrees with respect to the normal line of the upper faces of the nanowire regions 3. Although the upper face of each of the nanowire regions 3 made of polycrystalline silicon is covered with the hard mask 13a, the nanowire regions 3 are amorphized as impurity ions are implanted into substantially the entire nanowire regions 3 through the side faces. Meanwhile, the regions to be the source region 8 and the drain region 9 have great widths. Accordingly, the impurity ions implanted through the side faces only reach the end portions of the regions to be the source region 8 and the drain region 9. Since large proportions of the upper faces of the regions to be the source region 8 and the drain region 9 are covered with the hard mask 13a, impurity ions are not implanted into the large proportions of those regions. Therefore, the large proportions of the regions to be the source region 8 and the drain region 9 other than the end portions are not amorphized. FIG. 8 illustrates a situation where the nanowire regions 3 and the regions to be source region 8 and the drain region 9 in this situation, seen from above. The entire nanowire regions 3 are amorphized, and contain a large amount of implanted impurity ions. On the other hand, the regions 15 to be the source region 8 and the drain region 9 have end portions 21 and 22 amorphized, and these end portions 21 and 22 contain a large amount of implanted impurity ions. In the regions 15, however, the impurity ions are hardly implanted into the regions other than the end portions 21 and 22, and therefore, the impurity ion concentration (the content of impurity ions per unit volume) is lower than in the nanowire regions 3 and in the end portions 21 and 22 of the regions 15 to be the source region 8 and the drain region 9. Since the regions 15 to be the source region 8 and the drain region 9 are much larger than the nanowire regions 3 in terms of volume, the mean concentration of implanted impurity ions is lower in the regions 15 than in the nanowire regions 3.

Examples of impurity ion species for the amorphization include Ge, F, N, C, B, P, As, Ar, and Si. The implantation conditions are such that the entire nanowire regions 3 are amorphized. For example, the impurity ion species is Ge, the implantation angle is 30 degrees, the acceleration energy is 10 keV, and the ion concentration is $1 \times 10^{15}$ cm$^{-2}$.

A second heat treatment is then performed, to crystallize the amorphized nanowire regions 3. Since most of the regions 15 to be the source region 8 and the drain region 9 remain crystallized, the crystallization in the nanowire regions 3 progresses faster in a case where the crystals in the regions 15 to be the source region 8 and the drain region 9 are used as seed crystals in the crystal growth than in a case where nuclei are randomly formed in the nanowire regions 3 in the crystal growth. As a result, the nanowire regions 3 are crystal-grown, with the seed crystals being the crystals in the regions 15 to be the source region 8 and the drain region 9. Therefore, the crystals grow in the directions indicated by the arrows in FIG. 9. Thus, in the nanowire regions 3, the crystal grains become larger than those observed after the first heat treatment.

After the hard mask 13a is removed, the gate insulating film 5 is formed on the side faces and the upper face of each of the nanowire regions 3. Here, the gate insulating film 5 may be a silicon oxide film, a silicon oxynitride film, a high-dielectric-constant film, or a film stack consisting of a silicon oxide film and a high-dielectric-constant film.

A gate electrode film (not shown) is then formed on the gate insulating film 5, and a mask for gate electrode patterning (not shown) is further formed on the gate electrode film. With the use of this mask, patterning is performed on the gate electrode film and the gate insulating film, to form the gate electrode 6 (see FIGS. 1 through 3). Through the patterning, the gate electrode 6 and the gate insulating film 5 are left on part region of each of the nanowire regions 3. However, the gate electrode 6 and the gate insulating film 5 are removed from the other regions in the nanowire regions 3 and from the regions 15 to be the source region 8 and the drain region 9, to expose those regions. The gate electrode may be poly-Si, a metal silicide, TiN, W, TaC, or a film stack consisting of poly-Si and a metal.

The gate sidewalls 7 are then formed on both sides of the gate electrode 6. The material of the gate sidewalls 7 may be an oxide film, a nitride film, or a film stack consisting of an oxide film and a nitride film. Impurity ions are then implanted into the other regions in the nanowire regions 3 and into the regions 15 to be the source region 8 and the drain region 9, to form the source region 8 and the drain region 9 on both sides of the gate sidewalls 7. In this manner, the impurity ions are also implanted into the other regions in the nanowire regions 3, and the other regions in the nanowire regions 3 also become part of the source region 8 and part of the drain region 9. Before or after the ion implantation, a silicon layer of several tens of nanometers in thickness may be epitaxially grown on the regions 15 to be the source region 8 and the drain region 9, to reduce parasitic resistance.

Thereafter, the conventional procedures for manufacturing a transistor are performed, to complete a polycrystalline silicon nanowire transistor.

In the above description, a tri-gate structure is employed by forming the gate insulating film 5 on the side faces and the upper face of each of the nanowire regions 3 made of a polycrystalline material. However, a FinFET structure can be employed by forming the gate insulating film 5 only on the side faces of each of the nanowire regions 3, or a gate-all-around structure can be employed by forming the gate insulating film 5 not only on the upper face and the side faces but also on the lower face of each of the nanowire regions 3.

To manufacture a FinFET structure, the same procedures as those described above are carried out, after the gate insulating film 5 is formed, with the hard mask 13a being left on each of the nanowire regions 3. To manufacture a gate-all-around structure, the oxide film 2 beneath the nanowire regions 3 is removed by a hydrofluoric acid treatment. The gate insulating film 5 is then formed, and thereafter, the same procedures as those of the above described manufacturing method are carried out.

As described above, by the semiconductor manufacturing method according to the first embodiment, the crystal grains in the nanowire regions made of a polycrystalline material or in the channel regions can be made larger. Accordingly, the mobility and the ON-state current of the nanowire transistor can be greatly improved.

An experiment conducted to check the improvement in performance of a nanowire transistor manufactured by the above described manufacturing method is now described. By the above described manufacturing method, polycrystalline silicon nanowire transistors in which the width of each nanowire region 3 was approximately 21 nm and the height of each nanowire region 3 (the thickness of the polycrystalline silicon layer) was approximately 23 nm were manufactured. The thickness of the oxide film 2 formed on the bulk silicon substrate 1 was 100 nm, and both the first and second heat treatments for crystallizing the amorphous silicon layer were performed in a nitrogen atmosphere at 850° C. The oblique ion implantation for amorphization was performed by implanting Ge ions with an implantation energy of 10 keV in acceleration voltage, at a concentration of $1 \times 10^{15}$ cm$^{-2}$, and at an angle of 30 degrees with respect to a direction perpendicular to the silicon substrate 1. A sample in which the oblique ion implantation for amorphization was performed, and a sample in which the oblique ion implantation for amorphization was not performed were prepared, and the influences on the electrical characteristics of the transistors were checked.

Figure 10:
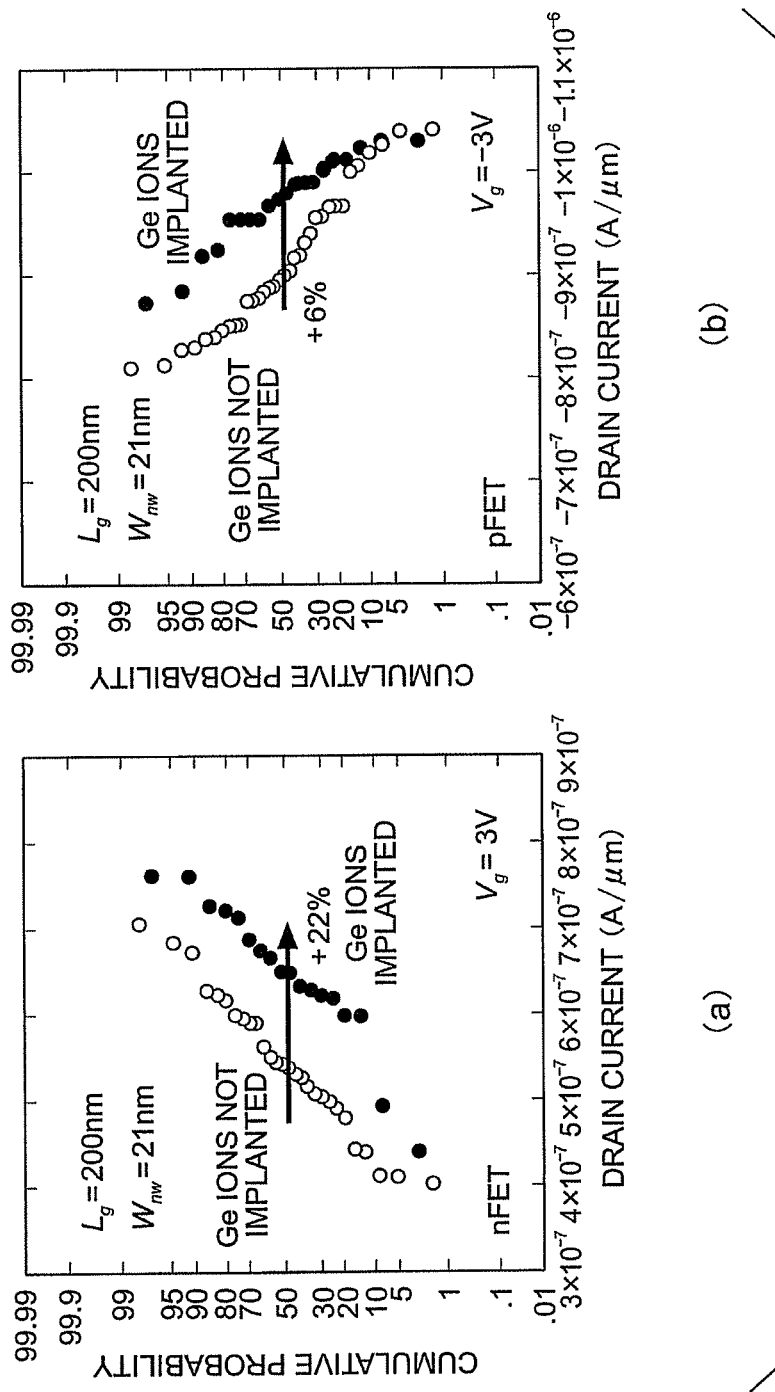
FIGS. 10(a) and 10(b) are graphs showing the results of measurement of drain current distributions in polycrystalline silicon nanowire transistors.

FIGS. 10(a) and 10(b) show the results of measurement of variations in the cumulative frequency distributions of the drain current in nanowire transistors that depend on whether the impurity ion implantation for amorphization was performed. FIG. 10(a) shows the measurement results with respect to an n-type nanowire transistor. FIG. 10(b) shows the measurement results with respect to a p-type nanowire transistor. The measured device gate length is 200 nm, and the nanowire width is 21 nm. The values of drain currents where the drain voltage was 10 mV and the gate voltage was 3 V were measured.

The oblique impurity ion implantation for amorphization and the crystal growth in the nanowire regions 3 having the crystals in the source region and the drain region as the seed crystals were performed. As a result, the drain current increased approximately 22% in the n-type transistor on average, and approximately 6% in the p-type transistor on average. That is, the drain current increased in both the n-type transistor and the p-type transistor.

Figure 11:
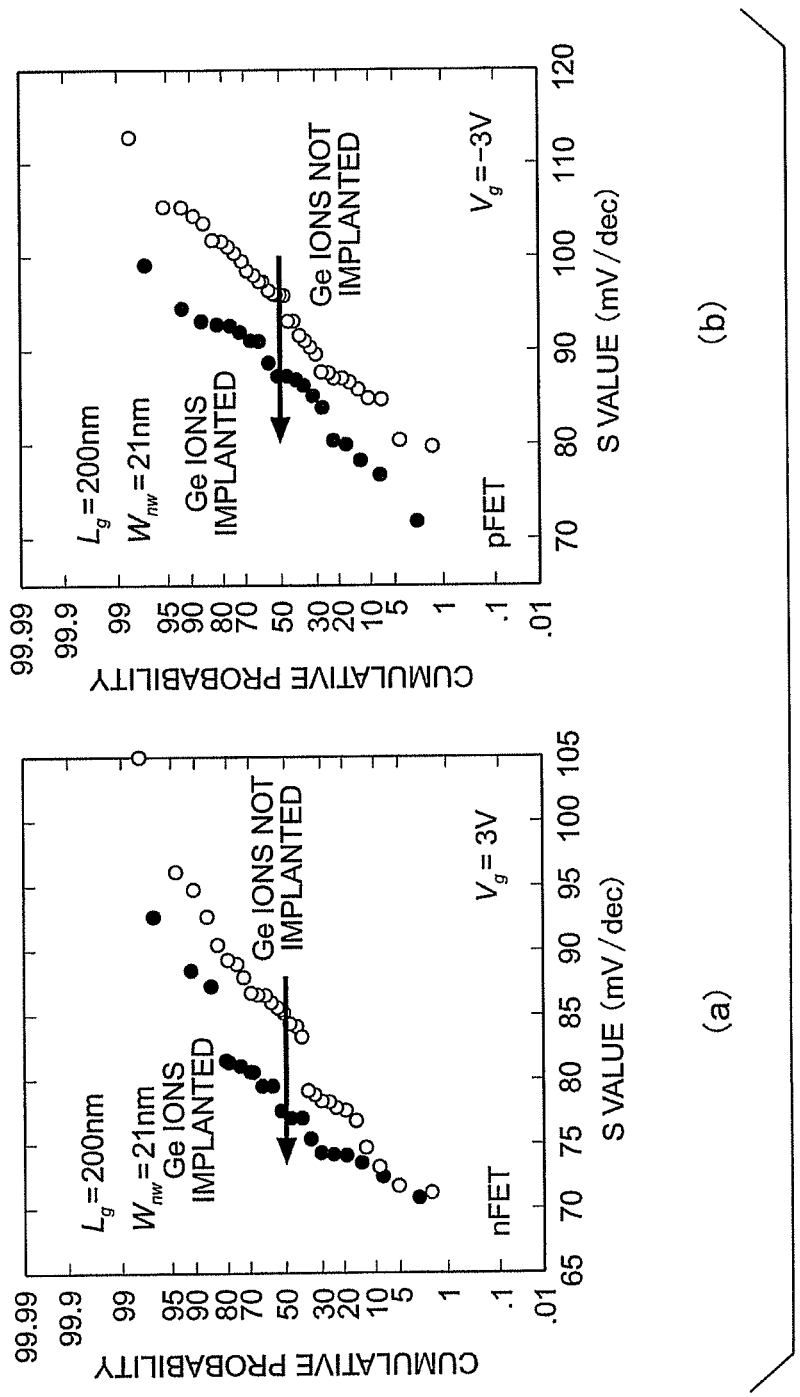
FIGS. 11(a) and 11(b) are graphs showing the results of measurement of S value distributions in polycrystalline silicon nanowire transistors.

To improve the performance of a transistor, it is critical not only to increase the drain current (the ON-state current) when a high voltage is applied to the gate, but also to lower the drain current (the OFF-state current) when a voltage is not applied to the gate. To lower the OFF-state current while maintaining a high ON-state current, it is critical to make the rise of the drain current steep at the time of gate voltage application. The indicator of the steepness of a rise of a drain current is an S value (subthreshold factor). The smaller the S value is, the steeper the current rise is. In that case, the OFF-state current can be lowered. FIGS. 11(a) and 11(b) show the results of measurement of variations in the cumulative frequency distributions of the S values of nanowire transistors, depending on whether the ion implantation for amorphization was performed. FIG. 11(a) shows the measurement results with respect to the n-type nanowire transistor, and FIG. 11(b) shows the measurement results with respect to the p-type nanowire transistor. Since the oblique ion implantation for amorphization was performed, the S value became smaller both in the n-type transistor and the p-type transistor.

When charges are captured into traps existing in the crystal grain boundaries, the current value and the S value of a polycrystalline silicon transistor are normally degraded, or the current value becomes smaller and the S value becomes larger. Therefore, an increase in the current value and a decrease in the S value caused by the oblique impurity ion implantation for amorphization and the crystal growth in the nanowire regions having the crystals in the source region and the drain region as seed crystals indicate that the trap density in the crystal grain boundaries becomes lower, or that the number of crystal grain boundaries becomes smaller (the crystal grain size becomes larger).

Also, variations in characteristics among devices can be restrained by lowering the trap density in the crystal grain boundaries or reducing the number of crystal grain boundaries.

As described above, according to the first embodiment, the ON-state current can be increased, the OFF-state current can be reduced, the S value can be made smaller, and the variations in characteristics among devices can be restrained. Also, as a bulk substrate is used in the first embodiment, the costs can be made much lower than the costs for a monocrystalline silicon nanowire transistor manufactured with the use of a SOI substrate. Although the nanowire regions 3, and the source region 8 and the drain region 9 are Si layers in this embodiment, Ge layers, SiC layers, or SiGe layers can also be used.

Second Embodiment

Figure 12:
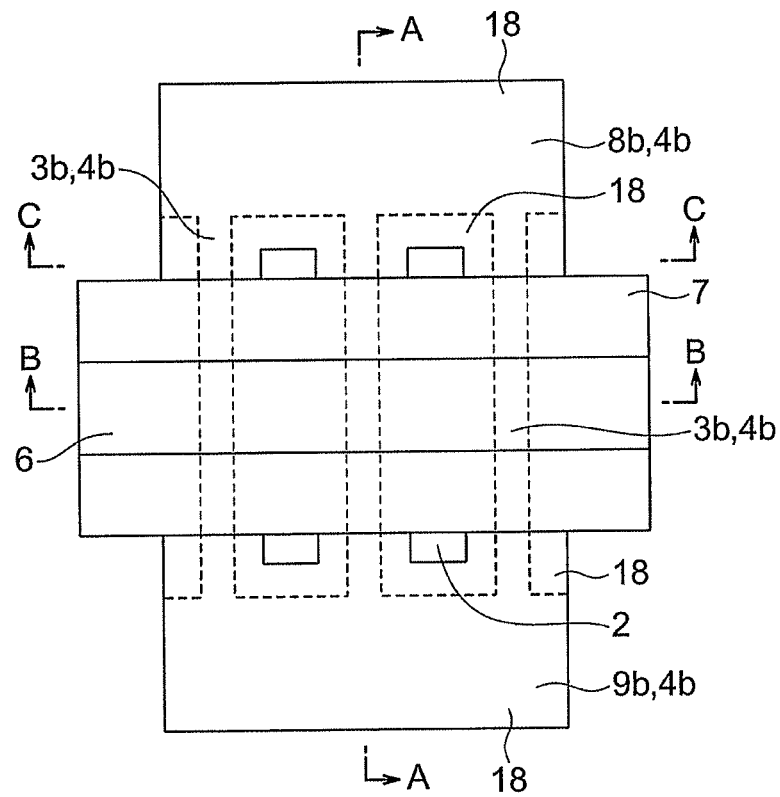
FIG. 12 is a top view of a semiconductor device according to a second embodiment.
Figure 13:
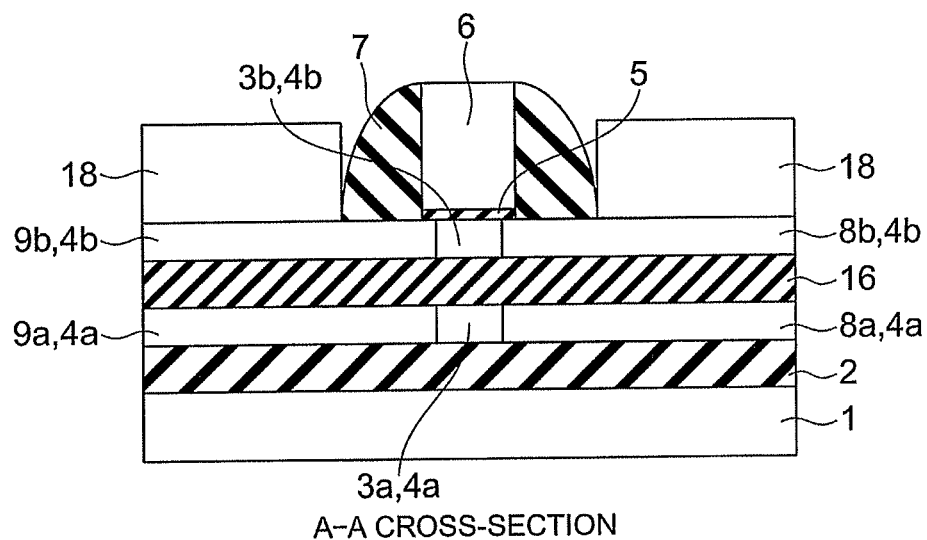
FIG. 13 is a cross-sectional view of the semiconductor device according to the second embodiment, taken along the section plane A-A shown in FIG. 12.
Figure 14:
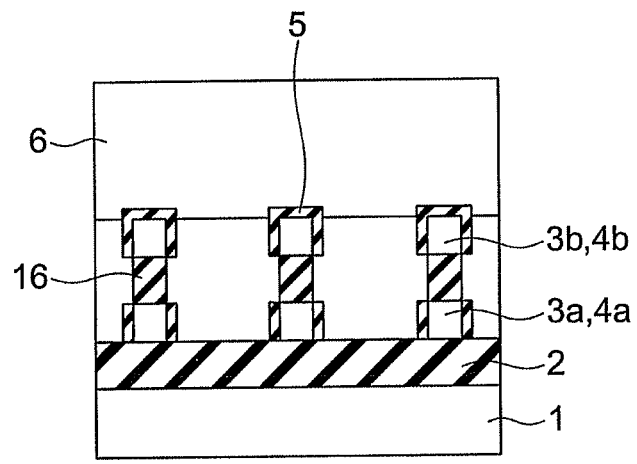
FIG. 14 is a cross-sectional view of the semiconductor device according to the second embodiment, taken along the section plane B-B shown in FIG. 12.
Figure 15:
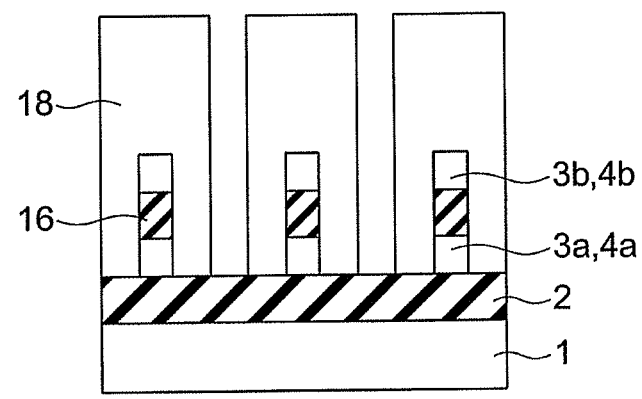
FIG. 15 is a cross-sectional view of the semiconductor device according to the second embodiment, taken along the section plane C-C shown in FIG. 12.

FIGS. 12 through 15 show a semiconductor device according to a second embodiment. The semiconductor device of the second embodiment includes a polycrystalline silicon nanowire transistor. FIG. 12 is a plan view of the nanowire transistor. FIG. 13 is a cross-sectional view taken along the section plane A-A of FIG. 12. FIG. 14 is a cross-sectional view taken along the section plane B-B of FIG. 12. FIG. 15 is a cross-sectional view taken along the section plane C-C of FIG. 12. The section plane A-A is a section plane in the gate length direction, and the section plane B-B is a section plane in the gate width direction.

This embodiment is the same as the first embodiment, except that two or more polycrystalline silicon layers are stacked. That is, two or more layers of nanowire regions are stacked, with an insulating film (an oxide film) being interposed in between.

The nanowire transistor of the second embodiment includes an oxide film 2 formed on a silicon substrate 1, a polycrystalline silicon layer 4a formed on the oxide film 2, an oxide film 16 formed on the polycrystalline silicon layer 4a, and a polycrystalline silicon layer 4b formed on the oxide film 16.

The polycrystalline silicon layer 4a includes one or more plate-like nanowire regions 3a including channel regions, and a source region 8a and a drain region 9a formed on both sides of each of the nanowire regions 3a. In FIG. 12, three nanowire regions 3a are formed, and each of the nanowire regions 3a is connected to the source region 8a and the drain region 9a. That is, the source region 8a and the drain region 9a serve as the common source region and the common drain region among the nanowire regions 3a.

The polycrystalline silicon layer 4b also includes one or more plate-like nanowire regions 3b including channel regions, and a source region 8b and a drain region 9b formed on both sides of each of the nanowire regions 3b. In FIG. 12, three nanowire regions 3b are formed, and each of the nanowire regions 3b is connected to the source region 8b and the drain region 9b. That is, the source region 8b and the drain region 9b serve as the common source region and the common drain region among the nanowire regions 3b. The nanowire regions 3b, the source region 8b, and the drain region 9b are located immediately above the nanowire regions 3a, the source region 8a, and the drain region 9a.

A gate insulating film 5 is then formed on the side faces of each nanowire region 3a in the direction from the source region 8a to the drain region 9a, on the side faces of each nanowire region 3b in the direction from the source region 8b to the drain region 9b, and on the upper face of each nanowire region 3b (see FIG. 14). A gate electrode 6 is formed to cover the gate insulating film 5. Gate sidewalls 7 made of an insulating material are formed on the side faces of the gate electrode 6 on the side of the source region and on the side of the drain region (see FIGS. 13 and 14).

Epitaxially-grown silicon layers 18 are formed to bridge the respective side faces of the regions in the nanowire regions 3a and 3b not covered with the gate sidewalls 7 and the gate electrode 6, and to bridge the respective side faces of the source regions 8a and 8b on the side of the nanowire regions 3a and 3b (see FIGS. 12 and 15). The epitaxially-grown silicon layers 18 are also formed to bridge the respective side faces of the drain regions 9a and 9b on the side of the nanowire regions 3a and 3b (see FIGS. 12 and 15). By virtue of the epitaxial silicon layers 18, the upper and lower source regions 8a and 8b are electrically connected to each other, and the upper and lower drain regions 9a and 9b are electrically connected to each other. The epitaxially-grown silicon layers 18 also cover the upper faces of the nanowire regions 3b, and the upper faces of the source region 8b and the drain region 9b (see FIG. 15).

In the nanowire transistor having this structure, the regions in the nanowire regions 3a and 3b above which the gate electrode 6 is formed serve as the channel regions. The channel region in each nanowire region has a plate-like structure (a nanowire structure) with a width (a length in the gate width direction) of approximately 3 to 25 nm, and a height of approximately 3 to 40 nm. As in the first embodiment, the nanowire regions 3a in the polycrystalline silicon layer 4a and the nanowire regions 3b in the polycrystalline silicon layers 4b contain a large amount of impurity ions implanted at the time of oblique impurity ion implantation for amorphization. The density of the contained impurity ions is higher than the density of the impurity ions contained in the non-nanowire regions in the polycrystalline silicon layer 4a and the polycrystalline silicon layer 4b.

Referring now to FIGS. 16 through 19, a method for manufacturing the semiconductor device according to the second embodiment is described.

Figure 16:
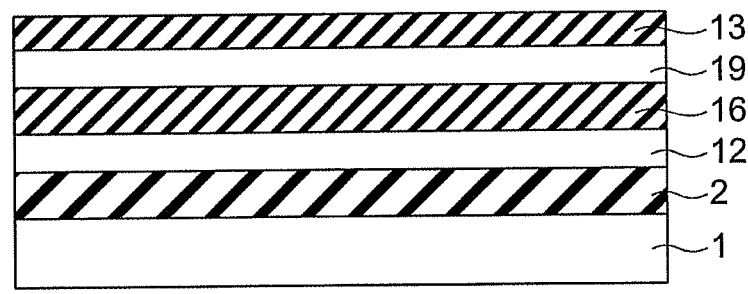
FIG. 16 is a cross-sectional view showing a semiconductor device manufacturing process according to the second embodiment.

First, as shown in FIG. 16, the oxide film 2, an amorphous silicon layer 12, the oxide film 16, an amorphous silicon layer 19, and a hard mask layer 13 are formed in this order on the bulk silicon substrate 1. The thicknesses of the amorphous silicon layer 12 and the amorphous silicon layer 19 are approximately 3 to 40 nm. Instead of an amorphous silicon layer, a polycrystalline silicon layer can be formed. In such a case, the later described first heat treatment becomes unnecessary.

Figure 17:
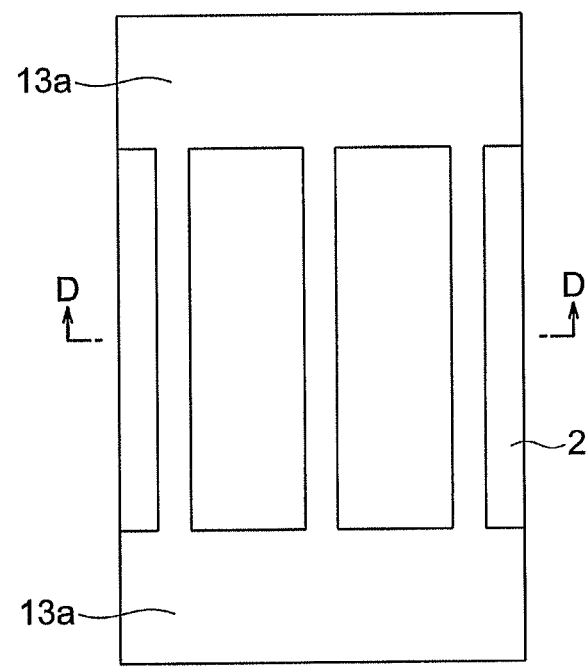
FIG. 17 is a top view showing the semiconductor device manufacturing process according to the second embodiment.
Figure 18:
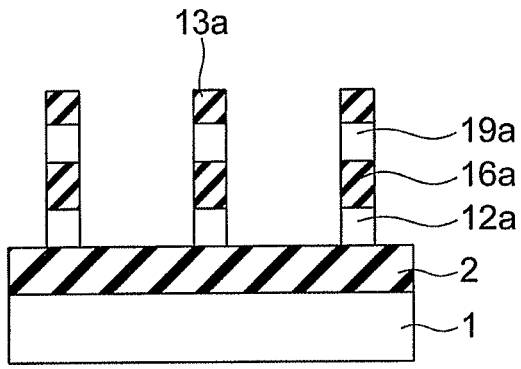
FIG. 18 is a cross-sectional view showing a semiconductor device manufacturing process according to the second embodiment.

As shown in FIGS. 17 and 18, patterning is then performed on the hard mask layer 13 by a known lithography technique to form a hard mask 13a. Etching is then performed on the amorphous silicon layer 19, the oxide film 16, and the amorphous silicon layer 12 with the use of the hard mask 13a. FIG. 17 is a top view of the structure after the etching, and FIG. 18 is a cross-sectional view taken along the section plane D-D of FIG. 17. Through the etching, the amorphous silicon layer 12 and the amorphous silicon layer 19 turn into an amorphous silicon layer 12a and an amorphous silicon layer 19a that include nanowire regions 3a and 3b narrowed in the gate width direction, and wide regions that are connected to the nanowire regions 3a and 3b and are located on both sides of the nanowire regions 3a and 3b. Also, through the above etching, the oxide film 16 turns into a patterned oxide film 16a. In FIG. 17, the amorphous silicon layer 12a and the amorphous silicon layer 19a cannot be seen, hidden by the hard mask 13a. The width of each of the nanowire regions 3a and 3b is approximately 3 nm to 25 nm. As the hard mask 13a, a silicon oxide film, a silicon nitride film, or the like can be used.

The first heat treatment is then performed, to crystallize the amorphous silicon layer 12a and the amorphous silicon layer 19a and form polycrystalline silicon layers. The first heat treatment may be performed immediately after the process to form the amorphous silicon layer 12 and the amorphous silicon layer 19, and form the hard mask layer 13 illustrated in FIG. 16. The heat treatment is preferably performed in a nitrogen atmosphere at 400 to 1200° C. for several microseconds to several tens of hours. However, crystallization may be performed by laser anneal. In the first heat treatment, the crystal grains in the nanowire regions 3a and 3b remain minute crystal grains, having being crystal-grown from nuclei randomly formed.

Figure 19:
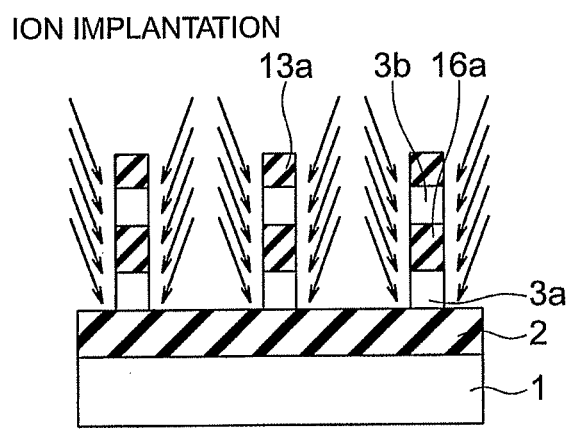
FIG. 19 is a cross-sectional view showing a semiconductor device manufacturing process according to the second embodiment.

As shown in FIG. 19, impurity ions are implanted into the polycrystalline silicon layers obliquely from above, or in a direction tilted with respect to the direction from one of the wide regions to the other one of the wide regions connected to the nanowire regions and at an angle that is greater than 0 degree but is smaller than 90 degrees with respect to the normal line of the upper face of each nanowire region. Although the upper face of each of the nanowire regions 3a and 3b made of polycrystalline silicon is covered with the hard mask 13a and the oxide film 16a, the nanowire regions 3a and 3b are amorphized as impurity ions are implanted into substantially the entire nanowire regions 3a and 3b through the side faces. Meanwhile, the regions to be the lower source region 8a and the lower drain region 9a that are made of polycrystalline silicon, and the regions to be the upper source region 8b and the upper drain region 9b that are made of polycrystalline silicon have great widths. Accordingly, as in the first embodiment, the impurity ions implanted through the side faces only reach the end portions of the regions to be the source regions 8a and 8b and the drain regions 9a and 9b. Since large proportions of the upper faces of the regions to be the source regions 8a and 8b and the drain regions 9a and 9b are covered with the hard mask 13a and the oxide film 16a, impurity ions are not implanted into the large proportions of those regions. Therefore, as in the first embodiment the large proportions of the regions to be the source region 8a and the drain region 9a made of polycrystalline silicon, and the regions to be the source region 8b and the drain region 9b made of polycrystalline silicon are not amorphized. Accordingly, as in the first embodiment, in the regions to be the source regions 8a and 8b and the drain regions 9a and 9b, the mean concentration of implanted impurity ions is lower than that in the nanowire regions 3a and 3b.

Examples of impurity ion species for the amorphization include Ge, F, N, C, B, P, As, Ar, and Si. The implantation conditions are such that the entire nanowire regions 3a and 3b are amorphized. For example, the impurity ion species is Ge, the implantation angle is 30 degrees, the acceleration energy is 10 keV, and the ion concentration is $1\times10^{15}$ cm$^{-2}$.

A second heat treatment is then performed, to crystallize the amorphized nanowire regions 3a and 3b. Since most of the source regions 8a and 8b and the drain regions 9a and 9b remain crystallized, the crystallization in the nanowire regions 3a and 3b progresses faster in a case where the crystals in the source regions 8a and 8b and the drain regions 9a and 9b are used as the seed crystals in the crystal growth than in a case where nuclei are randomly formed in the nanowire regions 3 in the crystal growth. As a result, the nanowire regions 3a and 3b are crystal-grown, with the seed crystals being the crystals in the source regions 8a and 8b and the drain regions 9a and 9b. Accordingly, in the nanowire regions 3a and 3b, the crystal grains become larger, as described in the first embodiment with reference to FIG. 9.

After the hard mask 13a is removed, the gate insulating film 5 is formed on the side faces of the nanowire regions 3a and on the side faces and the upper faces of the nanowire regions 3b. Here, the gate insulating film 5 may be a silicon oxide film, a silicon oxynitride film, a high-dielectric-constant film, or a film stack consisting of a silicon oxide film and a high-dielectric-constant film.

A gate electrode film is then formed on the gate insulating film 5, and a mask for gate electrode patterning is further formed on the gate electrode film. With the use of this mask, patterning is performed on the gate electrode film and the gate insulating film 5, to form the gate electrode 6 (see FIGS. 12 through 14). Through the patterning, the gate electrode 6 and the gate insulating film 5 are left on part region of each of the nanowire regions 3b and 3a. The gate electrode 6 may be poly-Si, a metal silicide, TiN, W, TaC, or a film stack consisting of poly-Si and a metal.

After the hard mask 13a is removed, the gate sidewalls 7 are then formed on both sides of the gate electrode 6. The material of the gate sidewalls 7 can be an oxide film, a nitride film, or a film stack consisting of an oxide film and a nitride film.

The silicon layers 18 of several tens of nanometers in thickness are epitaxially formed in the regions on the outer sides of the gate sidewalls 7, or in the regions in the nanowire regions 3a and 3b not covered with the gate electrode 6 and in the regions to be the source regions 8a and 8b and the drain regions 9a and 9b. With this arrangement, the regions to be the upper and lower source regions 8a and 8b are electrically connected to each other, and the regions to be the upper and lower drain regions 9a and 9b are electrically connected to each other. Alternatively, impurity-doped silicon layers can be formed as the silicon layers 18 through epitaxial growth, so that the source regions 8a and 8b and the drain regions 9a and 9b can be formed without the later described ion implantation process. Also, the epitaxial growth can not be performed. In that case, the regions to be the upper and lower source regions 8a and 8b are electrically connected to each other, and the regions to be the upper and lower drain regions 9a and 9b are electrically connected to each other in the manufacturing wire process.

Ions are then implanted into the regions in the nanowire regions 3a and 3b not covered with the gate electrode 6, into the regions to be the source regions 8a and 8b and the drain regions 9a and 9b, and into the silicon layers 18 formed through the epitaxial growth. Through the ion implantation, the source regions 8a and 8b and the drain regions 9a and 9b are formed.

Thereafter, the conventional procedures for manufacturing a transistor are performed, to complete a polycrystalline silicon nanowire transistor.

In the above description, two polycrystalline silicon layers are described. However, a structure in which three or more polycrystalline silicon layers are stacked, with an insulating film interposed between each two of the polycrystalline silicon layers, can be formed by the same manufacturing method as above.

In the second embodiment, the crystal grains in the nanowire regions made of polycrystalline silicon can be made larger, as in the first embodiment. Accordingly, the mobility and the ON-state current of the nanowire transistor can be greatly improved.

Also, in the second embodiment, the S values in n-type nanowire transistors and p-type nanowire transistors can be made smaller, the OFF-state current can be reduced, and variations in characteristics among devices can be reduced by lowering the trap density in the crystal grain boundaries in the nanowire regions made of polycrystalline silicon or increasing the crystal grain size, as in the first embodiment.

Also, in the second embodiment, polycrystalline silicon layers are stacked in the stacking direction. Accordingly, the amount of current (or the performance) of the nanowire transistor can be increased, without an increase in the occupied area of the substrate.

As a bulk substrate is used in the second embodiment, the costs can be made much lower than the costs for a monocrystalline silicon nanowire transistor manufactured with the use of a SOI substrate. Although the nanowire regions 3a and 3b, the source regions 8a and 8b, and the drain regions 9a and 9b are Si layers in this embodiment, Ge layers, SiC layers, or SiGe layers may also be used.

A monocrystalline silicon nanowire transistor having a stack structure may be formed by epitaxially forming and alternately stacking a monocrystalline silicon germanium layer and a monocrystalline silicon layer on a bulk substrate, and later burying a gate electrode in the region from which the silicon germanium layer is selectively removed. However, the selective removal of the silicon germanium layer complicates the manufacturing procedures, and characteristics degradation (or an increase in interface state density) occurs due to diffusion of germanium into the silicon channel. In the second embodiment, on the other hand, the manufacturing procedures are simpler, and characteristics degradation due to germanium does not occur.

The manufacturing method described in the second embodiment can be used for manufacturing large-capacity NAND flash memories each having a stack structure. In such a case, the read current can be increased, the off-leak current is reduced, and variations among devices can be reduced.

Third Embodiment

Referring now to FIGS. 20 through 23 and FIG. 1, a semiconductor device according to a third embodiment is described.

In the semiconductor device of the first embodiment, the nanowire regions 3 after the etching performed on amorphous silicon with the use of a hard mask each have a symmetrical structure connected to both the source region 8 and the drain region 9.

In the semiconductor device of the third embodiment, on the other hand, the nanowire regions 3 after the etching performed on amorphous silicon with the use of a hard mask each have an asymmetrical structure connected to one of the source region 8 and the drain region 9. In this asymmetrical structure, the crystal growth in the nanowire regions 3 after a heat treatment for amorphization is performed with the seed crystals extracted only from one of the source region 8 and the drain region 9.

In the following, a method of manufacturing the semiconductor device of the third embodiment is described.

First, as in the first embodiment, an oxide film 2, an amorphous silicon layer 12, and a hard mask layer 13 are formed in this order on a bulk silicon substrate 1, as shown in FIG. 4. The thickness of the amorphous silicon layer 12 is approximately 3 nm to 40 nm. Instead of an amorphous silicon layer, a polycrystalline silicon layer may be formed.

Figure 20:
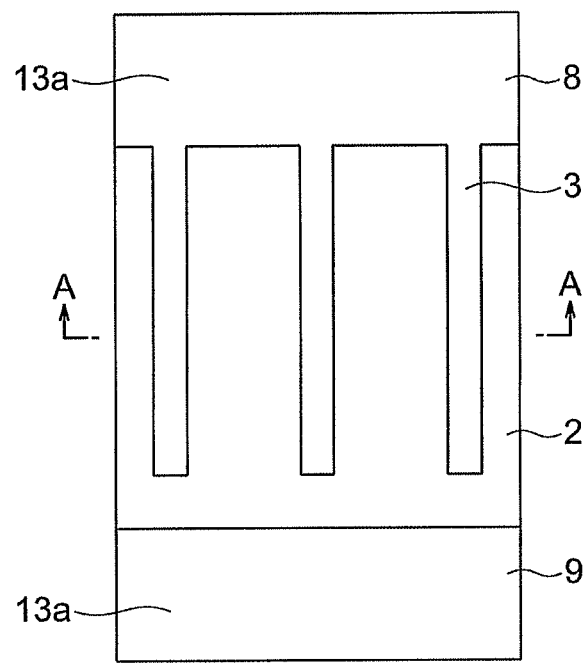
FIG. 20 is a top view showing the semiconductor device manufacturing process according to a third embodiment.
Figure 21:
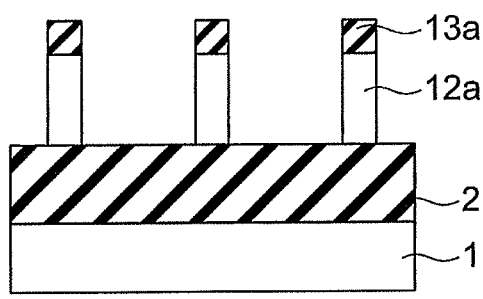
FIG. 21 is a cross-sectional view showing a semiconductor device manufacturing process according to the third embodiment.

As shown in FIGS. 20 and 21, patterning is then performed on the hard mask layer 13 by a known lithography technique, to form a hard mask 13a. Etching is then performed on the amorphous silicon layer 12 with the use of the hard mask 13a. FIG. 20 is a top view of the structure after the etching, and FIG. 21 is a cross-sectional view taken along the section plane A-A of FIG. 20. Through the etching, the amorphous silicon layer 12 turns into an amorphous silicon layer 12a that includes nanowire regions 3 narrowed in the gate width direction and wide regions to be the source region and the drain region. However, as shown in FIG. 20, the hard mask 13a used in this embodiment has a planar shape in which the regions to be the nanowire regions are connected to the region to be the source region but are not connected to the region to be the drain region. Alternatively, it is possible to form a structure in which the nanowire regions 3 are not connected to the region to be the source region but are connected to the region to be the drain region. In FIG. 20, the nanowire regions 3 and the regions to be the source region and the drain region cannot be seen, hidden by the hard mask 13a. The width of each nanowire region 3 is approximately 3 nm to 25 nm. As the hard mask layer 13, a silicon oxide film, a silicon nitride film, or the like can be used.

A first heat treatment is then performed, to crystallize the amorphous silicon layer 12a. The heat treatment may be performed in the stage shown in FIG. 7. The heat treatment is preferably performed in a nitrogen atmosphere at 400 to 1200° C. for several microseconds to several tens of hours. However, crystallization can be performed by laser anneal. In this embodiment, the crystal grains in the nanowire regions 3 remain minute crystal grains, having been crystal-grown from nuclei randomly formed.

Figure 22:
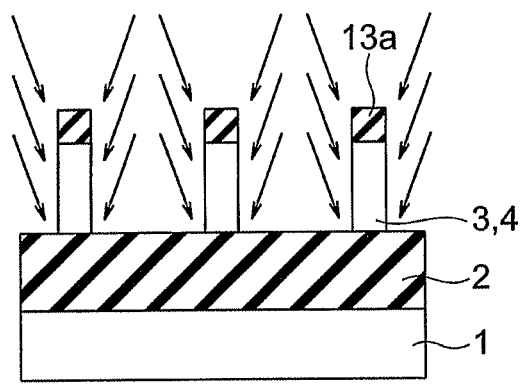
FIG. 22 is a cross-sectional view showing a semiconductor device manufacturing process according to the third embodiment.
Figure 23:
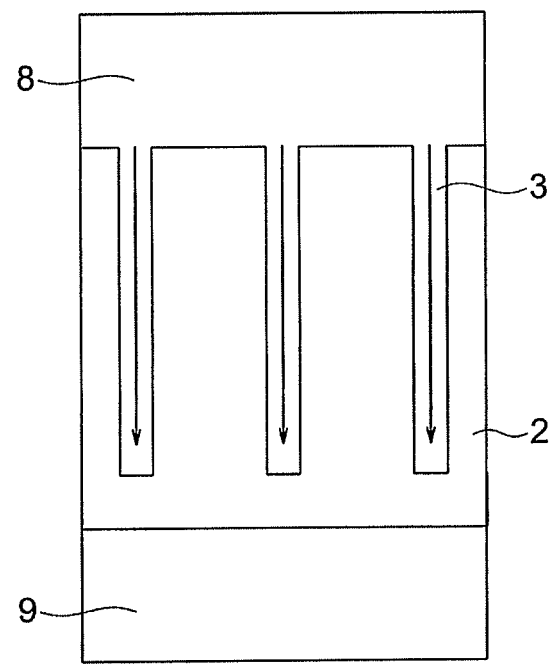
FIG. 23 is a top view showing the semiconductor device manufacturing process according to the third embodiment.

As shown in FIG. 22, impurity ions are implanted into the nanowire regions 3 obliquely from above, or in directions tilted with respect to the direction from one of the wide regions to the other one of side regions and at an angle that is greater than 0 degree but is smaller than 90 degrees with respect to the normal line of the upper faces of the nanowire regions. Although the upper face of each of the nanowire regions 3 is covered with the hard mask 13a, the nanowire regions 3 are amorphized as impurity ions are implanted into substantially the entire nanowire regions 3 through the side faces, as described in the first embodiment. Meanwhile, the regions to be the source region 8 and the drain region 9 have great widths. Accordingly, the impurity ions implanted through the side faces only reach the end portions of the regions to be the source region 8 and the drain region 9. Since large proportions of the upper faces of the regions to be the source region 8 and the drain region 9 are covered with the hard mask 13a, impurity ions are not implanted into the large proportions of those regions. Therefore, the large proportions of the regions to be the source region 8 and the drain region 9 other than the end portions are not amorphized. Therefore, in the regions to be the source region 8 and the drain region 9, the mean concentration of implanted impurity ions is lower than that in the nanowire regions 3.

Examples of impurity ion species for the amorphization include Ge, F, N, C, B, P, As, Ar, and Si. The implantation conditions are such that the entire nanowire regions 3 are amorphized. For example, the impurity ion species is Ge, the implantation angle is 30 degrees, the acceleration energy is 10 keV, and the ion concentration is $1 \times 10^{15}$ cm$^{-2}$.

A second heat treatment is then performed, to crystallize the amorphized nanowire regions 3. Since most of the regions to be the source region and the drain region remain crystallized in this embodiment, the crystallization of the nanowire regions 3 progresses faster in a case where the crystals in the regions 15 to be the source region 8 are the seed crystals in the crystal growth than in a case where nuclei are randomly formed in the silicon nanowires 4 in the crystal growth. As a result, the nanowire regions 3 are crystal-grown, with the seed crystals being the crystals in the region to be the source region 8, as indicated by the arrows in FIG. 23, and the crystal grains become larger.

After the hard mask 13a is removed, the gate insulating film 5 is formed on the side faces and the upper face of each of the nanowire regions 3. Here, the gate insulating film 5 may be a silicon oxide film, a silicon oxynitride film, a high-dielectric-constant film, or a film stack consisting of a silicon oxide film and a high-dielectric-constant film.

A gate electrode film is then formed on the gate insulating film 5, and a mask for gate electrode patterning (not shown) is further formed on the gate electrode film. With the use of this mask, patterning is performed on the gate electrode film and the gate insulating film, to form the gate electrode 6. Through the patterning, the gate electrode 6 and the gate insulating film 5 are left on part region of each of the nanowire regions 3. However, the gate electrode 6 and the gate insulating film 5 are removed from the other regions in the nanowire regions 3 and from the regions to be the source region 8 and the drain region 9, to expose those regions. The gate electrode can be poly-Si, a metal silicide, TiN, W, TaC, or a film stack consisting of poly-Si and a metal.

The gate sidewalls 7 are then formed on both sides of the gate electrode 6. The material of the gate sidewalls 7 can be an oxide film, a nitride film, or a film stack consisting of an oxide film and a nitride film.

Silicon layers of several tens of nanometers in thickness are then epitaxially grown in the regions on the outer sides of the gate sidewalls 7, or in the regions in the nanowire regions 3 not covered with the gate electrode 6 and in the regions to be the source region and the drain region. With this arrangement, the nanowire regions 3 are electrically connected to the region to be the drain region 9. Alternatively, impurity-doped silicon layers can be formed as the silicon layers through epitaxial growth, so that the source region and the drain region can be formed without the later described ion implantation process. Also, the epitaxial growth can not be performed. In that case, the nanowire regions 3 are electrically connected to the region to be the drain region 9 in the manufacturing wire process.

Ions are then implanted into the regions in the nanowire regions 3 not covered with the gate electrode 6, into the regions to be the source region and the drain region, and into the silicon layers formed through the epitaxial growth. Through the ion implantation, the source region 8 and the drain region 9 are formed (see FIG. 1).

Thereafter, the conventional procedures for manufacturing a transistor are performed, to complete a polycrystalline silicon nanowire transistor.

In the above description, a tri-gate structure is employed by forming the gate insulating film 5 on the side faces and the upper face of each of the nanowire regions 3 made of a polycrystalline material. However, a FinFET structure can be employed by forming the gate insulating film 5 only on the side faces of each of the nanowire regions 3, or a gate-all-around structure can be employed by forming the gate insulating film 5 not only on the upper face and the side faces but also on the lower face of each of the nanowire regions 3.

To manufacture a FinFET structure, the same manufacturing procedures as those described above are carried out, after the gate insulating film 5 is formed, with the hard mask 13a being left on each of the nanowire regions 3. To manufacture a gate-all-around structure, the oxide film 2 beneath the nanowire regions 3 is removed by a hydrofluoric acid treatment. The gate insulating film 5 is then formed, and thereafter, the same procedures as those of the above described manufacturing method are carried out.

As described above, according to the third embodiment, the crystal grains in the nanowire regions made of a polycrystalline material or in the channel regions can be made larger. Accordingly, the mobility and the ON-state current of the nanowire transistor can be greatly improved.

In the third embodiment, crystals are grown only from one of the source region and the drain region, and therefore, the crystal grain boundaries in the vicinity of the central area, which are formed in cases where crystals are grown from both the source region and the drain region, are not formed.

Also, in the third embodiment as in the first embodiment, the ON-state current can be increased, the OFF-state current can be reduced, the S value can be made smaller, and the variations in characteristics among devices can be restrained. Also, as a bulk substrate is used in the third embodiment, the costs can be made much lower than the costs for a monocrystalline silicon nanowire transistor manufactured with the use of a SOI substrate. Although the nanowire regions 3, and the source region 8 and the drain region 9 are Si layers in the third embodiment, Ge layers, SiC layers, or SiGe layers can also be used.

While certain embodiments have been described, these embodiments have been presented by way of example only, and are not intended to limit the scope of the inventions. Indeed, the novel methods and systems described herein can be embodied in a variety of other forms; furthermore, various omissions, substitutions and changes in the form of the methods and systems described herein can be made without departing from the spirit of the inventions. The accompanying claims and their equivalents are intended to cover such forms or modifications as would fall within the scope and spirit of the inventions.

What is claimed is:

1. A method of manufacturing a semiconductor device, comprising:

forming a first insulating film on a semiconductor substrate;

forming a first semiconductor layer on the first insulating film, and forming a mask on an upper face of the first semiconductor layer, the first semiconductor layer including:

a first region having:
   a first side face and a second side face opposite to the first side face, and
   a first width along a first direction from the first side face to the second side face;

a second region having a second width along a second direction parallel to the first direction, the second width being greater than the first width; and a third region having a third width along a third direction parallel to the first direction, the third width being greater than the first width, at least one of the second and third regions being connected to the first region, and the first, second, and third regions being covered by the mask;

performing, using the mask, a first ion implantation to implant ions into substantially the entire first region through the first and second side faces of the first region of the first semiconductor layer to transform the first region to an amorphous semiconductor;

performing, after the first ion implantation is performed, a first heat treatment including:

crystallizing the first region of the first semiconductor layer, with crystals in the at least one of the second and third regions being seed crystals;

forming, after the mask is removed, a gate insulating film at least on the first and second side faces of the first region of the first semiconductor layer;

forming a gate electrode on the gate insulating film;

forming gate sidewalls made of an insulating material on side faces of the gate electrode on sides of the second and third regions; and performing a second ion implantation at least into the second and third regions of the first semiconductor layer.

2. The method according to claim 1, wherein
the first semiconductor layer prior to the first ion implantation is a polycrystalline semiconductor layer.

3. The method according to claim 1, wherein the performing of the first ion implantation includes implanting ions in a direction tilted with respect to a direction from the second region to the third region and at an angle that is greater than 0 degree but is smaller than 90 degrees with respect to a normal line of an upper face of the first region.

4. The method according to claim 1, wherein
the first semiconductor layer is an amorphous semiconductor layer before the mask is formed, and
the method further comprises polycrystallizing the first semiconductor layer by performing a second heat treatment, after the mask is formed and before the first ion implantation is performed.

5. The method according to claim 1, wherein
the first semiconductor layer is an amorphous semiconductor layer before the mask is formed,
the forming of the first semiconductor layer and the mask on the upper face of the first semiconductor layer includes:
   forming the amorphous semiconductor layer on the first insulating film;
   forming a mask layer on the amorphous semiconductor layer;
   forming a mask by performing patterning on the mask layer; and
   performing patterning on the first semiconductor layer, using the mask, and
the method further comprises polycrystallizing the first semiconductor layer by performing a second heat treatment, after the mask is formed and before the first ion implantation is performed.

6. The method according to claim 1, wherein the first region of the first semiconductor layer is connected to the second and third regions.

7. The method according to claim 1, wherein an ion species used in the performing the first ion implantation is one of Ge, F, N, C, B, P, As, Ar, and Si.

* * * * *